Oct. 31, 1967 C. RASHLEIGH 3,349,480

METHOD OF FORMING THROUGH HOLE CONDUCTOR LINES

Filed Nov. 9, 1962

2 Sheets-Sheet 1

INVENTOR
CLAYTON RASHLEIGH

BY J W Armbruster
ATTORNEY 3,349,480
Patented Oct. 31, 1967

3,349,480

METHOD OF FORMING THROUGH HOLE CONDUCTOR LINES

Clayton Rashleigh, Hyde Park, N.Y., assignor to International Business Machines Corporation, New York, N.Y., a corporation of New York Filed Nov. 9, 1962, Ser. No. 236,633
6 Claims. (Cl. 29—624)

This invention relates generally to means for forming conductive lines in holes through printed circuit boards, and more particularly to additive methods for depositing connections or windings between opposite faces of single ply or laminated circuit packages or magnetic core matrix structures.

An object of the invention is the provision of means for obtaining two or more conductors through a single hole in a printed circuit card. Means and methods are provided for forming fine lines in hard-to-get-at places such as small holes or notches.

Another object of the invention is to provide an improved process involving hole wall masking as a step with electroless metal deposition to create separate through hole conductor lines through an electronic module board or a core array holder.

It is another object of this invention to provide an improved method for placing a plurality of separate insulated conducting lines or windings on the walls of a single hole to connect complex circuitry on opposite faces of a substrate.

Another object of the invention is to provide improved means for winding a magnetic core array. Heretofore, core arrays of the type concerned have been assembled manually with the wire windings requiring tedious threading operations to assemble them on the cores. This manual technique of assembly has become increasingly time consuming and expensive due to the requirements of greater capacity memory arrays and the trend to smaller size cores.

Therefore, an object of this invention is to provide an improved magnetic core array which is adapted for automatic manufacture in a rapid and economical fashion.

It is an object of this invention to provide an improved core array which eliminates the need for threading wire conductors through the cores.

It is an object of the invention to provide an improved magnetic core array in which the cores are compactly and rigidly secure coincident with holes in a supporting member, and printed circuit windings received in the hole and core openings are in the form of cylindrical cagework lining the core opening and providing connections for core windings from one face of an array to another face.

An object of the invention is to provide an improved process for embedding cores and placing printed windings thereon in an economical fashion. An array holder is to be formed with columns and rows of holes to receive cores. Then with each core coated with an adhesive which is also of an insulating nature, the cores are embedded in the holder and ready for printed wiring. The partitioned plug or mask may have sharp edges and be of a size large enough so that when inserted into the core hole it scrapes the adhesive off discrete areas of the hole wall to not only eliminate unnecessary insulation but also seal off the uncoated core wall areas so that chemical copper deposits are coated only on an underlying adhesive. After an electroless deposit is effected, other deposits on the metal film may be made as chemical depositions or electroplated coatings to build up the thickness wherever needed.

Another object of the invention is to provide a universal kind of printed circuit board wherein a series of regularly arranged holes have plural through hole lines leading to a repeat pattern of lines and lands on both sides of the board. Closely grouped lands provide advantages semiconductor assembly. Leadless components may be assembled directly across through hole lines inside a board hole.

Another object of the invention is to provide means for selectively interconnecting the conductive plies of a laminated circuit package. A rectangular plug has side notches of varying depths in order to mask selectively any number of a plurality of laminated conductive layers of a stack of circuits. A hole through the laminated stack receives the plug and it acts as a mask for permitting chemical deposited copper to form directly or diagonally only between selected conductive ends of layers or lines exposed on the inside walls of the hole.

Another object of the invention is the provision of an alternative method of hole line formation involving a plug which is slightly oversize to act as a punch or scraper to remove selective portions of conductive hole wall lining which as been deposited all over the hole wall. Such scraping or punching may be employed after the thin chemically deposited layer is on or after both layers are in place including the thick electroplated layer.

The foregoing and other objects, features and advantages of the invention will be apparent from the following more particular description of the preferred embodiments of the invention, as illustrated in the accompanying drawings:

The present novel method comprises the steps of punching, drilling or forming holes in board material such as plastics, epoxy paper, ceramic, glass, etc. This is followed by a cleaning step and then the application of an adhesive. After the adhesive is dry, a partitioned plug is inserted in the hole as a mask to expose only certain discrete wall areas or lines extending from one board face to another or one laminar plane to another. The plug may fit snugly enough to scrape off unnecessary adhesive. The next step comprises dipping the board in a chemical copper deposition solution which forms a very thin layer of copper on all exposed surfaces and forms an intermediate bond between the adhesive and thicker electroplated copper which is deposited as the next step on all the surfaces conductivated by the first thin layer of copper, i.e., all over one or both faces, in separate sets of conductor lines through each hole previously masked, over a complete hole wall surface wherever unmasked, or absent altogether from a wall surface completely masked. After the copper electroplating step, a resist is screened or photo printed on the copper face to expose desired land areas and conductor lines certain of which connect to the through-hole lines already discretely placed. Then an acid resistant coating such as tin-lead or a precious metal such as gold is electroplated on the exposed areas including the through hole lines.

The resist coating is then removed and the underlying copper etched away to leave a desired circuit pattern or core winding array on one or both faces of the board and through the holes which may be magnetic core holes as holes in a matrix molded around cores.

Figure 1:
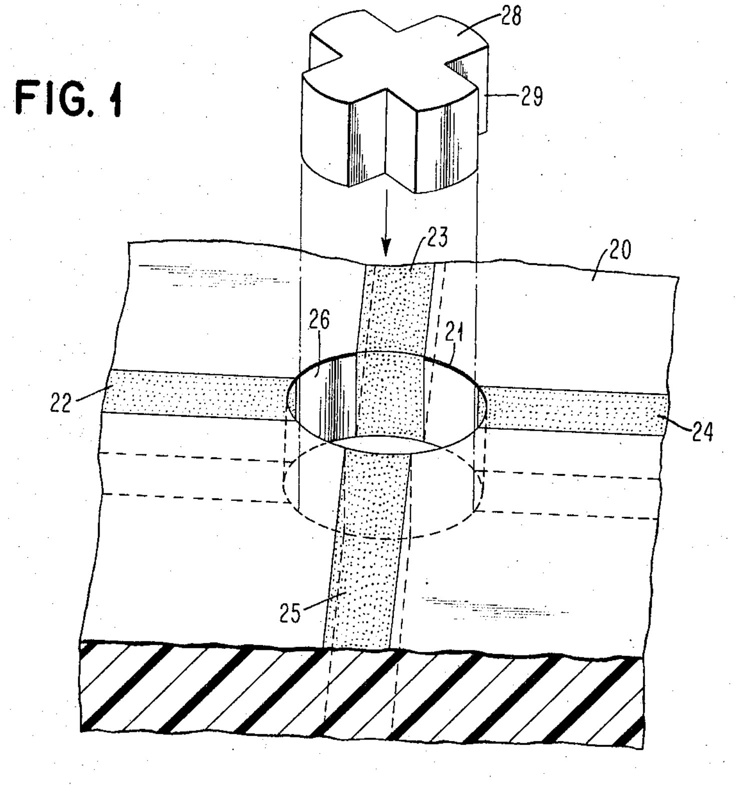
FIG. 1 is a perspective view showing one hole with printed lines and a used plug mask removed therefrom and poised above the hole in the position of removal.

Referring to FIG. 1, a substrate or board 20 is seen to be formed with an opening 21 and having four printed wiring lines 22–25 portions on both faces of the board and over the inner wall 26 of opening 21 as a plurality of through hole connections through the single hole or opening 21. The board, card or substrate 20 may be of phenolic composition, epoxy paper or glass, ceramic or glass and the opening, perforation or through hole 21 may be punched, drilled or molded in shape.

Before board 20 receives lines 22–25 it is cleaned and coated with an adhesive which is allowed to dry. Then a circular partitioned plug 28 formed with notches or grooves 29 is inserted to fill opening 21 except for wall spaces exposed by the grooves. It is optional whether the plug 28 is to fit snugly into the adhesive or instead bite into the adhesive and scrape it off wherever the plug periphery is of the arcuate shape matching the shape of the hole 21. The other steps used for the formation of lines 22–25 are performed as noted hereinbefore, or any of the well known additive printed circuit steps such as spraying, painting, sputtering, vacuum metallizing, plating, etc., may be used. Initial steps are considered "additive" steps herein when a substrate does not have a conductive metal foil coating present at the beginning of a process. A plurality of holes such as hole 21 may be treated at the same time, and when the plugs 28 are removed they may be cleaned and used over and over again as masks for a succession of jobs. In certain instances the plugs may be left in place and become permanent parts of the insulation.

Figure 2:
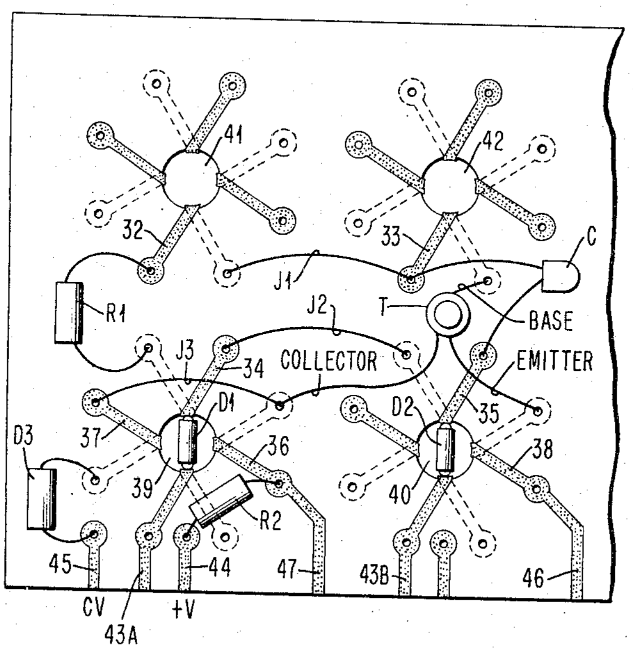
FIG. 2 is a plan view of a printed circuit board with a set of plated through holes, each hole containing a plurality of conductor lines for joining an example of electronic circuitry according to the present invention.

In FIG. 2 is shown a printed circuit board 31 holding a series of components, T, C, D1, D2, D3, R1 and R2, comprising a NOR network circuit and the leads of which are soldered in lands on conductor lines 32–38 which extend to and through holes 39, 40, 41 and 42 which are processed with a plurality of through hole lines by the means and methods of plug masking noted herein. On the opposite face of board 31 this component circuitry is connected to provide electronic controls within the board and to the outside as well by means of the edge terminal lines 43–47 which are for the purposes of the NOR circuit as input lines 43A and 43B, + voltage line 44, clamp voltage line 45, ground line 46 and output line 47. These edge contact lines 43–47 provide electrical connection to a plug in socket (not shown) in a control chassis.

In lieu of lead line connection, leadless components such as diodes D1 and D2 may be forced into a plated through hole and there have their conductive ends connect electrically with lines formed on the hole walls as already noted.

A series of jumper connections J1, J2 and J3 complete the circuit connections, so that use may be made of a standard conductor line arrangement on the board 31 with through holes 39–42 adapted either to receive small components such as D1 in direct contact or by means of lead lines soldered in lands.

FIG. 2 is a universal type board suited to carry many kinds of logic circuitry with short leads and easy connection. The grouping of lands, as shown, lends itself to many plural lead components as well as leadless types fitted into the holes.

Figure 3:
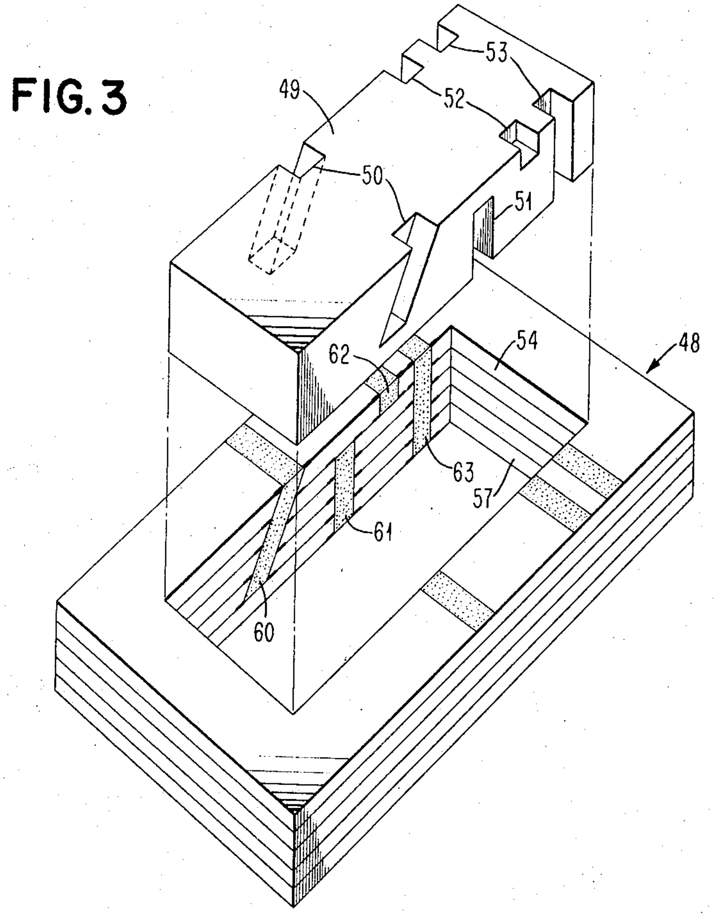
FIG. 3 is a perspective view of a laminated circuit package with hole wall lines of selective length and angularity for connecting desired circuit conductor laminations and land terminals by a process involving the use of a notched and grooved rectangular plug.

FIGURE 3 illustrates in perspective another fashion in which the novel method of the present invention may be employed. A hollow circuit package 48 is seen to be formed of a laminar structure comprising layers of 54–57 wherein circuit conductors and components may be assumed to be interiorly distributed between the different layers and also on outer surfaces. In order to make interior connections between such types of circuitry, it is assumed that the conductor lines run to the exposed interior walls and there they may be selected by masking other areas with an inserted rectangular plug 49 shown poised above the circuit package. One wall of the plug 49 is shown to be formed with notches 50, 51, 52 and 53 which extend different distances along the depth of the plug in conformity with the extent of different laminations 54–57 of the package with which the plug is to cooperate in the formation of conductive deposits such as 60, 61, 62 and 63 which are formed to coincide with the shapes of notches 50–53, assuming that both sides of plug 49 are notched in a similar fashion. Although only two sides of plug 49 are shown notched, it will be realized that one or all faces of the plug may be notched to act as a mask. The angular slot 50 serves to connect lines of different laminations at different points not necessarily aligned upon all laminations.

It is understood in connection with FIG. 3 that the plug 49 is to be used as outlined hereinbefore so that when inserted prior to a chemical deposition step or conductive spraying or etching of any kind, the plug will act as a mask for the selective placement of connecting electrical lines along the inner walls of an opening or hole. The preliminary deposition steps are followed by removal of the plug and subsequent definition of other parts of the circuitry by coating and plating techniques.

Figure 4:
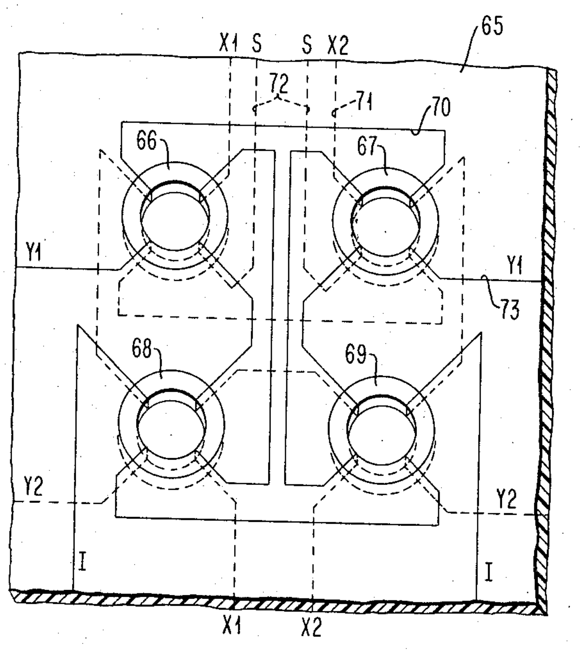
FIG. 4 is a plan view of a partial magnetic core array showing how four sets of windings are deposited with four lines of through hole form deposited with the aid of partitioned plugs.

In FIG. 4 there is shown a further modification in the form of a magnetic core array with windings including plural through hole connections provided according to the teachings of the present invention as set forth herein. The core array frame 65 is shown to hold a set of four cores 66–69 which are molded in place or held in any manner and coated with a thin layer of insulation material such as a plastic or adhesive to hold the cores in place and also provide a medium whereon winding lines may be deposited over and through the cores. As shown, a series of four different kinds of winding lines 70–73 are shown connected through all cores by means of connections afforded by four through hole conductors formed on the inner walls of the holes extending through the cores. It will be understood that these inner conductors are formed by means of the masking plug techniques set forth herein and that the other connected windings are formed by any printed circuit process such as the ones already explained. These windings may be used for the switching of a particular core and the sensing of a read out pulse therefrom as explained in detail in patents such as U.S. Patents 2,849,705 and 2,889,540.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a plurality of conductors inside a through hole in a substrate comprising the steps of forming a hole in the substrate, cleaning said substrate, coating said substrate and hole walls with an adhesive, inserting a partitioned plug in said hole to act as a mask and expose only certain discrete hole wall areas or lines extending from one substrate surface to another, said plug insertion scraping off unnecessary adhesive, dipping said substrate in a chemical copper deposition solution to form a thin layer of copper on all exposed surfaces and through hole lines, electroplating copper on all exposed surfaces, depositing a pattern of resist material on substrate surfaces to expose land areas and conductor lines certain of which lead to said through hole lines, electroplating an acid resistant coating on the exposed land areas, conductor lines and through hole lines, removing the resist material, and etching away the exposed copper material to leave a circuit pattern with conductor lines, land areas and through hole connecting conductor lines.

2. A method of forming a plurality of conductors through a hole in a substrate comprising the initial additive steps of coating said substrate and the hole walls with an adhesive, metallizing said substrate and the hole walls, inserting a partitioned pin to scrape off said metallizing on the hole walls except for a plurality of through hole lines, electroplating metal on said substrate and through hole lines, and finally forming a pattern of conductors on said substrate connecting with said through hole lines by means of final subtractive printed circuit process steps.

3. A method of depositing a plurality of conductors through a hole in a substrate comprising the steps of inserting a partitioned pin in said hole, metallizing said substrate surfaces and between the adjacent partitions on said pin to deposit a plurality of conductive lines through said hole, removing said pin, depositing a first plating on said substrate surfaces and said lines, placing a resist mask of line patterns with exposed plated surfaces over said substrate faces, depositing a second plating on said exposed substrate surfaces and lines to coat them with etch resist material, removing said resist mash, and etching away uncovered parts, said first plating serving to form conductor lines leading to and through said hole.

4. A method of depositing a plurality of conductors in a recess in a substrate comprising the steps of inserting a partitioned pin in said recess, coating adhesive on said substrate surfaces and between the adjacent partitions on said pin to deposit a plurality of lines on the walls of said recess, and depositing by additive printed circuit process steps a series of conductor lines on the surface of said substrate and extending to and on the walls of said recess to form conductor lines leading to and into said recess.

5. A method of depositing a plurality of conductors through a hole in a substrate comprising the steps of inserting a cross shaped notched pin in said hole, metallizing said substrate surfaces and on the four wall areas of said hole coinciding with the notches in said pin to deposit a plurality of conductive lines through said hole, removing said pin, electroplating copper on said substrate surfaces and said lines, placing a resist mask over said substrate faces to form a pattern of conductor lines, electroplating a tin-lead alloy on the uncovered substrate surfaces and lines to coat them with etch resist material, removing said resist mask, and etching away the first two coatings to form conductor lines leading to and through said hole.

6. A method of depositing a plurality of conductors through a hole in a substrate comprising the steps of inserting a partitioned pin in said hole, masking unselected areas of substrate surfaces, spraying conductive material on selected areas of said substrate surfaces and between the adjacent partitions on said pin to deposit a plurality of conductive lines through said hole, removing said pin, and electroplating additional conductive material on said areas and said lines to form conductor lines leading to and through said hole.

References Cited

UNITED STATES PATENTS

| | | | |
|---|---|---|---|
| 2,728,693 | 12/1955 | Cado. | |
| 2,891,880 | 6/1959 | Nakken | 117—38 X |
| 2,910,673 | 10/1959 | Block | 340—174 |
| 2,915,039 | 12/1959 | Wardley | 117—38 X |
| 2,934,748 | 4/1960 | Steimen | 340—174 |
| 2,961,745 | 11/1960 | Smith | 29—155.5 |
| 2,985,948 | 5/1961 | Peters | 29—155.5 |
| 3,075,866 | 1/1963 | Baker | 29—155.5 X |
| 3,080,541 | 3/1963 | Parker. | |
| 3,130,134 | 4/1964 | Jones | 29—155.5 X |
| 3,146,125 | 8/1964 | Schneble. | |
| 3,148,356 | 9/1964 | Hedden | 29—155.5 X |
| 3,163,588 | 12/1964 | Shortt | 29—155.5 X |
| 3,219,749 | 11/1965 | Schuster | 29—155.5 X |

OTHER REFERENCES

Reprint of paper delivered by Alan P. Kingsbury of Photocircuits Corporation at the June first meeting of the Institute of Radio Engineers professional group on production techniques (page 1).

JOHN F. CAMPBELL, *Primary Examiner.*

R. F. DROPKIN, *Assistant Examiner.*